(12) United States Patent
Aasen et al.

(10) Patent No.: US 11,849,555 B2
(45) Date of Patent: Dec. 19, 2023

(54) SUBSEA ENCLOSURE ARRANGEMENT

(71) Applicant: Siemens Energy AS, Oslo (NO)

(72) Inventors: Erlend Aasen, Jakobsli (NO); Håvard Hamstad, Trondheim (NO); Swethnag Mahidhar Padakandla, Heimdal (NO)

(73) Assignee: Siemens Energy AS, Oslo (NO)

( * ) Notice: Subject to any disclaimer, the term of this patent is extended or adjusted under 35 U.S.C. 154(b) by 488 days.

(21) Appl. No.: 17/175,631

(22) Filed: Feb. 13, 2021

(65) Prior Publication Data
US 2021/0267081 A1 Aug. 26, 2021

(30) Foreign Application Priority Data

Feb. 20, 2020 (GB) ...................................... 2002344

(51) Int. Cl.
*H05K 5/06* (2006.01)
*F16J 15/10* (2006.01)

(52) U.S. Cl.
CPC ............ *H05K 5/068* (2013.01); *F16J 15/104* (2013.01)

(58) Field of Classification Search
CPC ....................................................... H05K 5/00
See application file for complete search history.

(56) References Cited

U.S. PATENT DOCUMENTS

| 2,805,789 A | 9/1957 | Kreh, Jr. |
| 2017/0200394 A1* | 7/2017 | Albrecht ................ G09B 19/24 |
| 2017/0223845 A1* | 8/2017 | Drew ................... H05K 5/0217 |

FOREIGN PATENT DOCUMENTS

| CN | 205912396 U | 1/2017 |
| EP | 0247304 A2 | 12/1987 |
| EP | 2732125 A1 | 5/2014 |
| FR | 3011056 A1 | 3/2015 |
| JP | S56103909 A | 8/1981 |

* cited by examiner

*Primary Examiner* — Jerry Wu
(74) *Attorney, Agent, or Firm* — Wolter Van Dyke Davis, PLLC

(57) ABSTRACT

A subsea enclosure arrangement for a subsea component, the enclosure includes walls of a fluid tight material, each wall terminating in a flange; a cover for closing the enclosure; an elastomeric seal between the flange and the cover; compressive members to apply a compressive force to the elastomeric seal, via the cover and the flange; a bracket connecting the flange to the cover; a weld seal between the bracket and the flange; and a weld seal between the bracket and the cover.

15 Claims, 4 Drawing Sheets

SUBSEA ENCLOSURE ARRANGEMENT

CROSS REFERENCE TO RELATED APPLICATIONS

This application claims the benefit of and priority to United Kingdom Application No. GB 2002344.6 filed 20 Feb. 2020, which is incorporated by reference herein in its entirety.

FIELD OF INVENTION

This invention relates to a subsea enclosure arrangement for subsea, or underwater, equipment and an associated method of assembling such an arrangement.

BACKGROUND OF INVENTION

Traditionally, oil platforms are used in offshore oil and gas production. In the operation of offshore oil platforms, it can be necessary to install electrical equipment under water, e.g. for controlling functions of a subsea Christmas tree or a subsea blowout preventer. More recently, processing facilities have been relocated to the seabed. Installations on the seabed may comprise various modules, including pumps, compressors and the like which require electric power for operation. The power supply may be provided by means of a subsea power grid installed on the seabed, which may for example comprise a subsea transformer, a subsea switchgear and subsea variable speed drive for powering the aforementioned subsea loads. It is necessary that the installed equipment operates reliably even at the high pressures that prevail at the rated installation depths which can be 3000 m or more, so equipment is protected by enclosure tanks. Improvements to such enclosures are desirable.

SUMMARY OF INVENTION

In accordance with a first aspect of the present invention, a subsea enclosure arrangement for a subsea component, the enclosure comprising walls of a fluid tight material, each wall terminating in a flange; a cover for closing the enclosure; an elastomeric seal between the flange and the cover; compressive members to apply a compressive force to the elastomeric seal, via the cover and the flange; a bracket connecting the flange to the cover; a weld seal between the bracket and the flange; and a weld seal between the bracket and the cover.

The enclosure arrangement may further comprise a test port formed at a location in the cover between the elastomeric seal and the compressive members.

The bracket may comprise a plurality of angled profiles forming a rectangular outline; or a plurality of angled profiles forming a circular outline; or a curved profile forming a rectangular or circular outline.

The angled profile may comprise and L-shaped profile, the curved profile may comprise a semi-circular cylindrical profile, or variations on these according to the shape of the hatch and flange.

The enclosure walls may comprise a metal, in particular steel, or a plastic, in particular polyethylene.

The arrangement may be adapted to receive a subsea component comprising at least one of a transformer, a variable speed drive, a pump, a compressor, or a separator.

The arrangement may be adapted to receive a pressure compensating fluid within the enclosure.

The pressure compensating fluid may comprise oil or may comprise air, or other gas, in particular nitrogen.

The elastomeric seal may comprise one of an O-ring seal, S-seal, or gasket.

In accordance with a second aspect of the present invention, a method of installing a subsea component in a subsea enclosure arrangement for a subsea component comprises installing one or more components through an opening in an enclosure comprising walls of a fluid tight material; fitting an elastomeric seal to a flange of the walls of the enclosure; fitting a cover over the elastomeric seal to close the opening; applying a compressive force to the seal by tightening compressive members in the cover and flange; fitting a bracket over the compressive members; and welding the bracket to the cover and the flange.

The method results in a dual seal enclosure, the compressive members providing a first gas tight seal for the enclosure and welding the bracket to the cover and the flange providing a second gas tight seal for the enclosure.

The method may further comprise filling the enclosure or components in the enclosure with a pressure compensating fluid.

The pressure compensating fluid may comprise oil or a gas, in particular the gas may comprise air or nitrogen.

The method may further comprise forming a closable test port in the bracket between the elastomeric seal welds on the bracket and the compressive members.

The method may further comprise testing at the test port that a fluid tight seal has been formed between the inside of the enclosure and the ambient environment after applying the compressive force to the seal.

The testing may comprise applying a vacuum to attempt to suck helium gas liquid from within outside the enclosure through the elastomeric seal.

The method may further comprise testing at the test port that a gas tight seal has been formed between the weld and the ambient environment.

The testing may comprise spraying Helium gas to the outer surface of the weld and applying a vacuum and a Helium sniffer probe at the test port to determine whether gas has passed through the weld seal.

Although the seat for the elastomeric seal may be provided in only one of the flange or the cover, preferably the elastomeric seal is fitted in a seat in the flange and a corresponding seat is provided in the cover.

BRIEF DESCRIPTION OF THE DRAWINGS

An example of a subsea enclosure arrangement and associated method of assembling a subsea enclosure arrangement in accordance with the present invention will now be described with reference to the accompanying drawings in which.

DETAILED DESCRIPTION OF INVENTION

The enclosures used to protect equipment of a subsea power-grid system, need to provide effective protection from sea water ingress for long periods, typically 25 to 30 years. The enclosures typically comprise a receptacle or chamber, such as a tank, having a large opening to allow the installation of the equipment and access to components therein. The openings are closed with hatches which need to remain effective over time, yet also be able to be reopened, if and when maintenance of the equipment inside is required. The solution for closing the tank needs to be reliable when closed, whilst allowing easy access when the enclosures need to be opened. These hatches are traditionally sealed off using bolted flanges with elastomeric seals in-between the flange of the hatch and the flange of the tank, the seals being compressed when the flanges are bolted together. The elastomeric seals have a limited lifetime and degrade over time. Bolted connections that have been submerged in seawater for an extended period can also be difficult to reopen because of corrosion of the bolt or thread. These factors can reduce the reliability of the products. An alternative, as described in EP2732125, for a transformer, is to weld a peripheral edge of the closing plate to a flange of the transformer tank, with an O-ring seal having been provided inward of the weld, i.e. within the tank. Although, this may provide a reliable seal when initially closed off, this design may not be suitable for repeated re-opening and re-closing steps, as it is difficult to determine whether or not the flange has sustained damage in the process of un-welding the closing plate from the flange of the tank.

Figure 1:
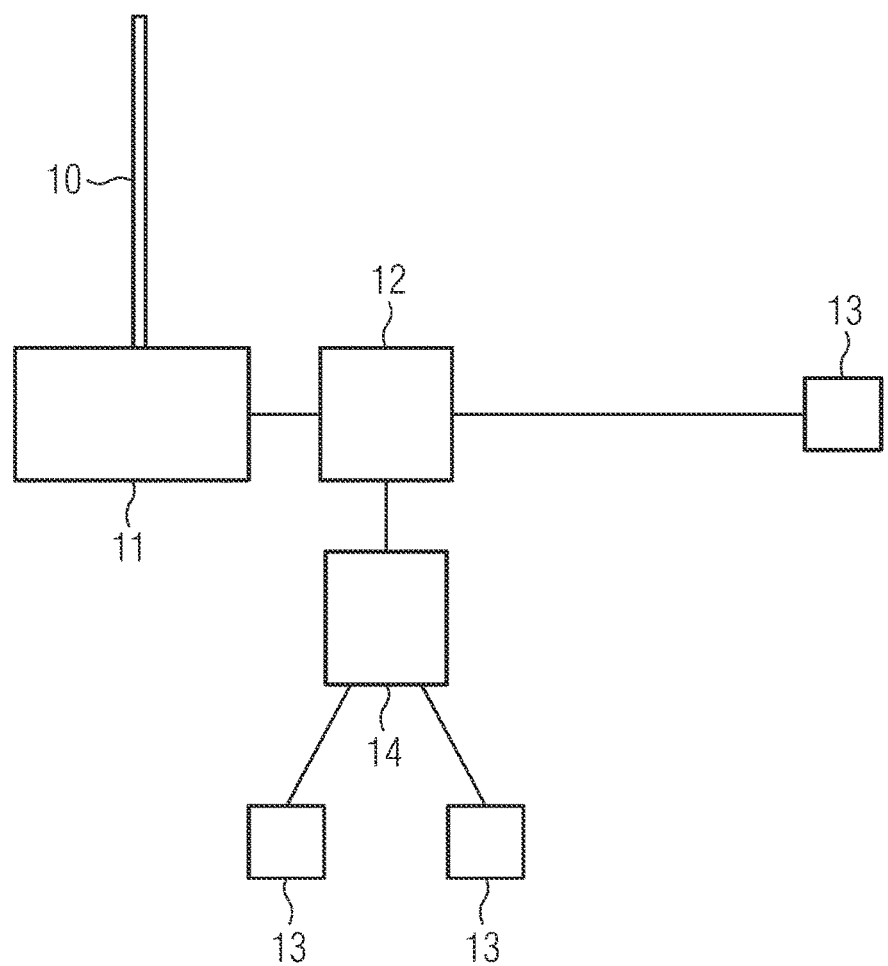
FIG. 1 is a block diagram of a typical subsea grid in which an enclosure arrangement according to the invention may be used.

FIG. 1 is a block diagram of a typical subsea grid in which equipment in enclosures which make use of the present invention may be used. The enclosures may protect equipment such as subsea transformers, switchgear and variable speed drives, pumps, compressors, separators, electric power relay units, control canisters with power electronics, or communication systems. The enclosures may comprise a pressure compensating fluid, for example, a 1 atmosphere canister, which is either air or gas filled, for example nitrogen filled, may include the invention to seal control and power devices. In other cases, the pressure compensating fluid within the subsea enclosure may be oil. Subsea equipment is typically deployed at depths of 10 metres or more and may be deployed at depths of several hundred metres, even up to 3000 metres depth. The pressures experienced at these depths require equipment to have effective and reliable seals to prevent sea water ingress.

Figure 2:
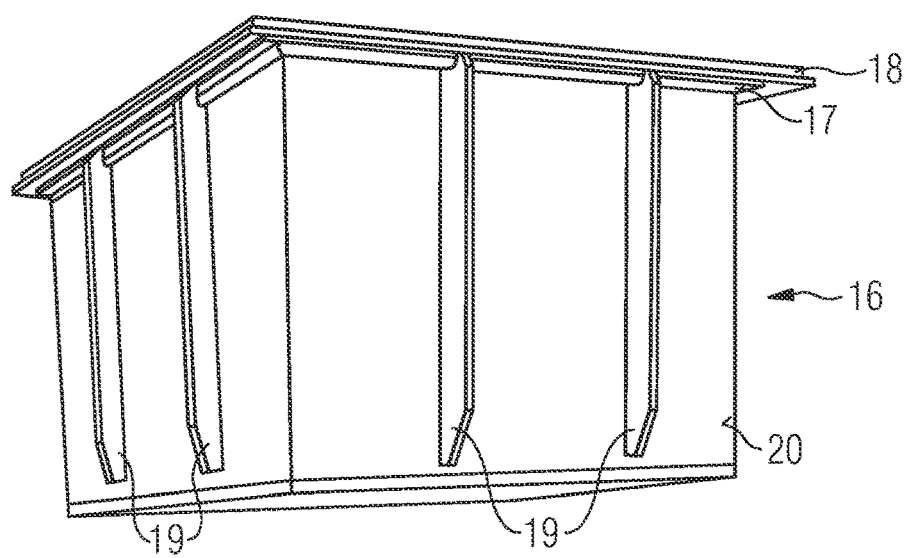
FIG. 2 illustrates an enclosure with a horizontally mounted cover for use in the grid of FIG. 1 to which the present invention may be applied.

In the example shown in FIG. 1, power may be supplied via a cable 10 to a transformer 11 and switchgear 12 through which the power is fed to loads 13, for example pumps, or separators, either directly, or through variable speed drives 14, according to the type of load. Each of the transformer, switchgear, variable speed drives and loads has its own, or a shared, enclosure, in which the equipment must be effectively sealed off from the seawater. An example of an enclosure 16, or tank, of a type which may be used for subsea equipment and incorporate the features of the present invention is illustrated in FIG. 2. The container 16 of this example, comprises side walls 20 having a flange 17 onto which a horizontally mounted cover, sealing plate, or hatch 18 may be sealed. Structural reinforcing members 19, integral with the container walls 20, may be also be provided to increase rigidity and resistance to pressure experienced at depths.

As described above, the norm has been to put a hatch or hatches or a sealing plate over the enclosure opening and provide a seal between the hatch and enclosure, for example by welding the hatch to the flange at the periphery. It is important to provide a reliable seal between the seawater outside and the equipment within the tank. In some cases, the equipment inside the enclosure 16 may be mounted in oil and the performance of the oil may be negatively affected if it becomes contaminated with seawater. Simply sealing the hatch 18 and container 16 with an O-ring seal is not sufficient, as seawater has a tendency to diffuse into the O-ring material over time and thence into the container. To improve reliability of the seal for equipment that is deployed subsea for long periods, a functional double barrier between the inside of the enclosure and the seawater outside the container, is required. As previously discussed, the flange 17 may be welded to the sealing plate 18, or hatch at its perimeter, to protect the O-ring inside, but this leaves doubt about the mechanical strength of the flange itself, if the weld is removed to allow access to the container, then the hatch is rewelded to the flange.

The present invention improves upon this by using an intermediate bracket, or frame, which allows a hatch or cover 18 to be fixed to the flange 17 of the enclosure 16, or container, using compressive fixing devices, such as bolts, clamps or dowel pins. The bracket or frame is welded to the flange 17 and the cover 18, but the flange and cover are not welded directly to one another. Addressing the problem of seal lifetime and reliability by means of the welded solution of the present invention in turn increases the lifetime and reliability of the entire product. Clamping to compress an elastomeric seal, such as an O-ring seal, S-seal, or flat gasket, is provided by the bolts, which bolt the cover to the flange of the container.

The welded brackets seal the bolts from seawater, so that there is a very limited likelihood of the bolts becoming corroded using this design arrangement. An alternative would be to use noble materials, if the bolts and flange in which they are seated cannot be kept away from the seawater, but this would be very expensive. The hatch is bolted to the flange to compress the elastomeric seal and the seal is tested, then the brackets are welded to the hatch and to the flange and the welds are tested. Conventional weld inspection methods are used to check for faults and a helium leak test is performed to check the quality of the seal. As there is no direct welding of the flange of the container to the hatch, then removing the hatch from the frame for accessing the container, for example by grinding out the weld, does not require any direct heating of the flange, so it can be assumed to be unaffected by the process and re-used. Welding is carried out on the frame, which can be replaced at a relatively low cost each time access is required. Re-welding of the bracket may be at a different location on the flange, or hatch, for example if the grinding or weld removal process causes damage.

Figure 3:
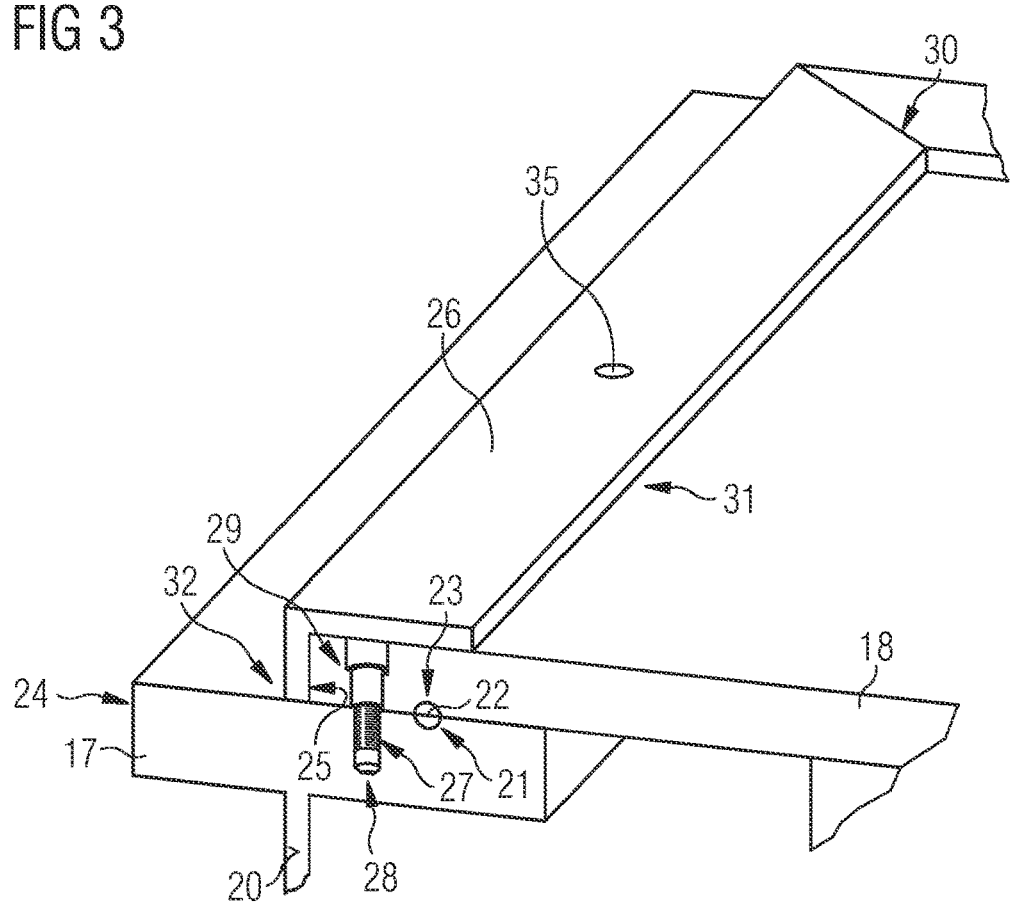
FIG. 3 shows more detail of the weld used in the enclosure of FIG. 2.

FIG. 3 illustrates more detail of the enclosure sealing arrangement according to the present invention, applicable to both horizontally and vertically mounted hatches. The view shows only part of the enclosure 16. The flange 17 extends from the top of the enclosure wall 20. An upper surface of the flange 17 is provided with a seat 21 in which an elastomeric seal 22, such as an O-ring seal, is located. The elastomeric seal has two main functions, the first being to temporarily seal off the enclosure 16 so that the enclosure and its internal components can be tested after having been oil filled. The elastomeric seal also creates a dry cavity 35 outside the body of the enclosure, but sealed from the seawater, which may be used for leak testing the seal weld as described hereinafter. In this example, a corresponding seat 23 for the elastomeric seal is provided in a lower surface of the hatch cover 18. Alternatively, only one of the flange and hatch cover has a seat formed in it and the other surface is flat (not shown). A screw thread for a bolt 27 may be provided in the body of the flange 17 by drilling and tapping. Preferably, the drill hole does not go all the way through the flange 17, but finishes at a point 28 above the lower surface 28 of the flange, so that the bolt is not exposed to seawater. A suitable length of threaded bolt 27 is chosen. In the hatch cover 18, a countersunk hole is cut to allow the head 29 of the bolt 27 to sit flush with the upper surface of the hatch 18. Although only one bolt 27 is visible in this illustration, in practice, a plurality of bolts are provided, which may be substantially evenly spaced from one another, along the flange/hatch interface. The bolts are screwed into the screw thread in the flange until the head of the bolt is flush with the upper surface of the hatch. If other fixings, such as dowel pins, or clamps, are used to provide the clamping effect, these are similarly protected from the seawater by the welded brackets.

Figure 7:
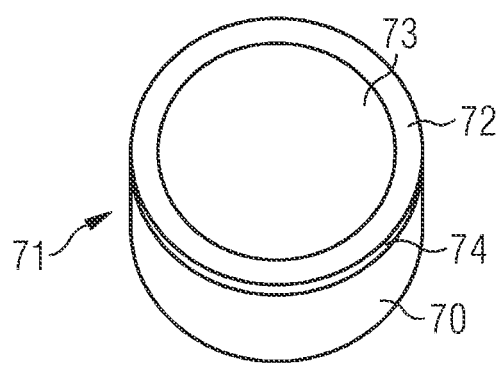
FIG. 7 illustrates an example of a circular enclosure, flange and hatch for which the present invention is applicable.
Figure 8:
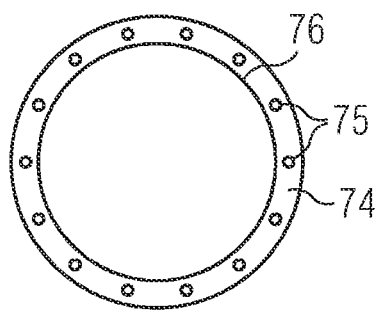
FIG. 8 illustrates the enclosure of FIG. 7 from above during assembly.

The outer edges 24, 25 of the flange 17 and the hatch 18 respectively are offset slightly, so that a bracket 26 may be fitted over the countersunk bolts 27. The bracket may take a number of different forms. In the example shown in FIG. 3, the bracket comprises a frame made of flat bars and angled profiles and the bracket is joined to the flange and to the hatch, covering the bolts. Alternatives, for a circular hatch, are illustrated in FIGS. 7 to 9. The bracket is then sealed to the hatch by welding at along weld seal lines 30, 31 and sealed to the flange along weld seal line 32. As described hereinafter, seal line 32 may be located on a different part of the flange, for a subsequent sealing step. The elastomeric seal is positioned far enough away from the weld lines, so it is not damaged by the heat of the welding. Part of the bracket may have an L-shaped profile, as shown in FIG. 3, or may have another profile, e.g. a curved profile, such as a semi-circular cylindrical profile (not shown). The bracket is used in combination with the bolts 27 to provide the seals. The clamping effect of the bolts 27 compresses the O-ring seal between the upper surface 21 of the flange 17 and the lower surface 23 of the hatch 18, forming the first seal. The L-shaped profile of the bracket 26, which is welded to each of the cover and flange, rather than welding the enclosure to the hatch directly, forms the second seal.

Figure 4:
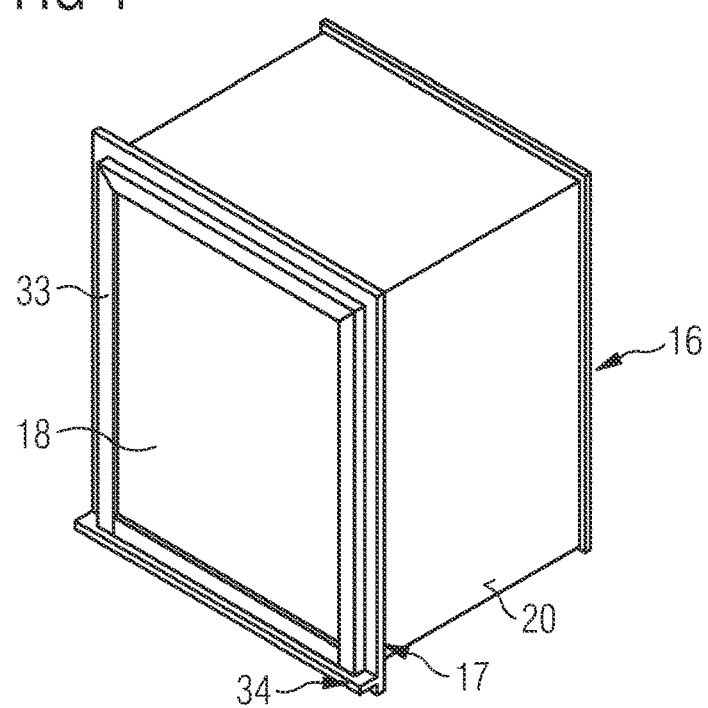
FIG. 4 illustrates an enclosure with a vertically mounted cover for use in the grid of FIG. 1 to which the present invention may be applied.

FIG. 4 illustrates another example of the invention, for a vertically mounted hatch on a rectangular enclosure 16. The hatch 18 is provided with angled profiles 33 on three edges which cover the bolts 27 and a rectangular bar at the base. However, other combinations of bracket types may be used. The enclosure flange 17 may comprise a shelf 34 at the base to receive the hatch and hold the hatch in the correct orientation to allow the compression of the elastomeric seal to be done. As the flange itself is not welded directly to the hatch, only to the bracket profiles, which can be replaced each time the enclosure 16 has to be re-opened and closed up again and the flange is wide enough to allow for welding at a different discrete weld line all the way along the flange on a subsequent welding step, then the flange itself is less likely to be subject to heat damage from the welding process and its integrity can be relied upon after the hatch has been sealed again.

Figure 5:
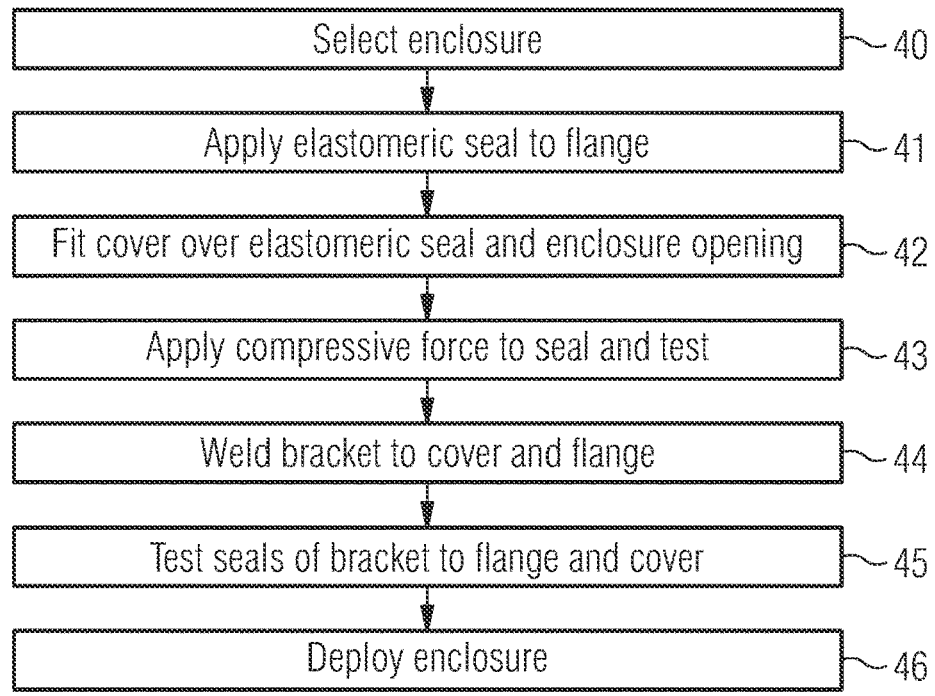
FIG. 5 is a flow diagram of a method of assembling an enclosure arrangement according to an aspect of the invention.

The process by which the enclosure 16 is sealed is illustrated in more detail in FIG. 5. An enclosure is selected 40 and the elastomeric seal is placed 41 in its seat 21 in the flange 17 of the enclosure 16. The hatch 18 is fitted 42 over the elastomeric seal with the seal appropriately located between the hatch and flange seats 21, 23. If only one of the surfaces has a seat, then the elastomeric seal is typically located in the surface with the seat first. The bolts 27 are tightened to the required torque setting to apply 43 a compressive force, which compresses the O-ring and seals the joint. A test of the effectiveness of this seal is made before any oil filing of the enclosure and electrical testing. When this has all been completed, the bracket is welded 44 to the hatch and to the flange, then the welds are inspected in a conventional manner and tested 45 to ensure the welds meet quality standards. A test of sealing effect may be carried out, for example, by providing a test port 35, or valve, through the top surface of the bracket 26. After the leak test, the test equipment is removed and the test port sealed with an elastomeric seal and weld.

To check the barrier formed by the O-ring, the test attempts to suck Helium gas through the O-ring from inside the enclosure, through the valve opening that has been used in the Helium test. If no Helium gas is detected, the seal is deemed to be sufficient. The bracket 26 is then fitted over the bolts and welded to the flange 17 and cover 18. To test the weld seal, helium gas may be sprayed over the welds and a vacuum is applied to the valve. If helium is detected through the test port, by a helium sniffer positioned inside the vacuum pump, then the welded seal may be deemed to be faulty. After the enclosure arrangement has been successfully tested it can be deployed subsea.

Figure 6:
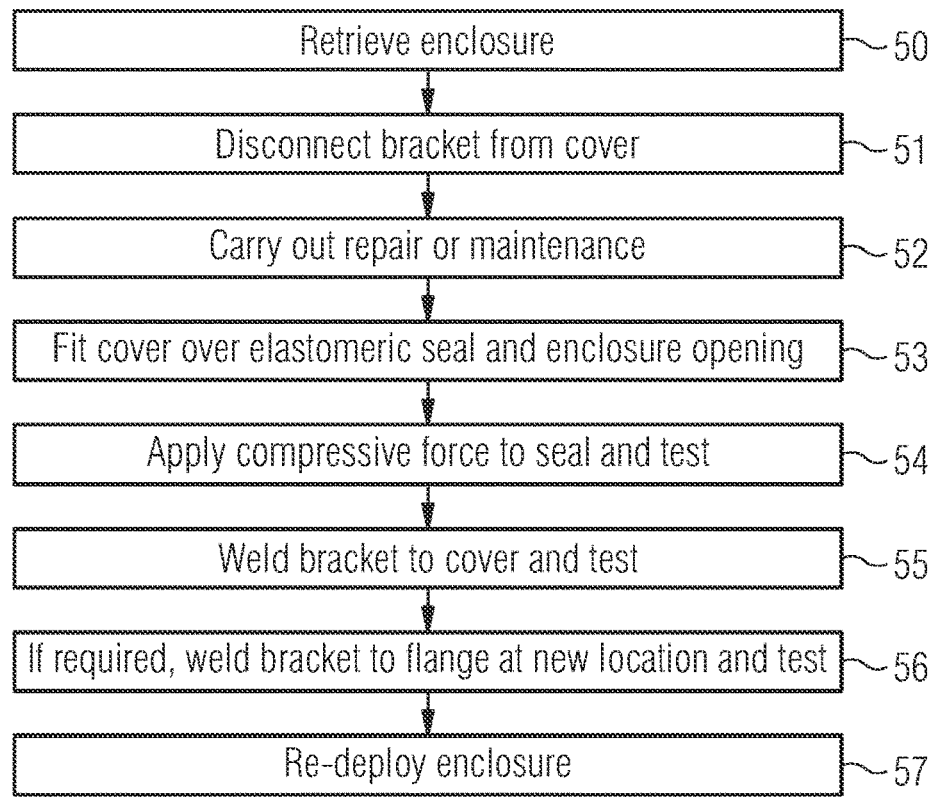
FIG. 6 is a flow diagram of a method of opening and re-closing an enclosure arrangement according to an aspect of the invention.

In the event that the hatch needs to be removed, as illustrated in FIG. 6, the enclosure must be retrieved 50 from its subsea location and the bracket 26 is disconnected 51 from the cover 18, for example by grinding out the weld. If required, the bracket is also from the flange 17. The maintenance, repair, or replacement of the equipment inside is carried out 52 and the hatch fitting and testing process 53 carried out again, if necessary, with new bracket 26 to replace the original, if required. (If necessary, the hatch can be reopened by cutting off the frame 26 and the frame sacrificed in this process). The seal surfaces for the elastomeric seal 22, and bolts 27, are not damaged during this process. A new cover, or the original cover is fitted 53 over the enclosure and opening and the bolts are tightened 54 to apply the compressive force on the seal 22. When closing the hatch 18 again, a new frame 26 may be made and welded 55 to the hatch. If the bracket has been disconnected from the flange, that is welded back on 56, or the new frame welded on. The new frame may be made with a slightly different geometry, for example slightly thicker than the wall thickness of the previous frame, to avoid welding on the same area of the hatch and flange. The available space allows for at least two or three re-welds before the weld would be on a previously used area. The welds need not be load bearing, as the bolts are load bearing, although in some cases the welds may be load bearing. The bracket is welded to the flange at the chosen location and when all testing has been completed, as previously described, then the enclosure can be deployed again 57 subsea.

Using the design and process of the present invention, the welded hatch is made as fluid tight as the rest of the enclosure which is proved by requiring the welds on the hatch profiles to pass the same leak test as the rest of the enclosure. The structural integrity is similarly tested for all necessary load cases, just as the rest of the enclosure would be. The combination of elastomeric seal 22, load bearing compressive elements 27 and seal welded bracket 26 fully protects the hatch, flange and bolts from the environment and makes it possible to reuse some of these parts if the enclosure has to be reopened after welding. The load bearing compressive elements 27 are positioned on the outside of the compressive seal, O-ring 22, with respect to the body of the enclosure. After testing is completed, the brackets, the shape and design of which is chosen according to the application and enclosure shape and type, are seal welded. The flange is not welded to the hatch directly, but indirectly, by welding the flange and hatch to the brackets. The brackets, whatever their profiles, can be replaced if there is a need for reopening the enclosure.

Figure 9A:
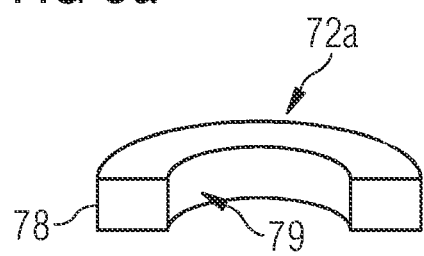
FIGS. 9a, 9b and 9c show alternative profiles for the brackets of FIG. 7.
Figure 9B:
Figure 9C:
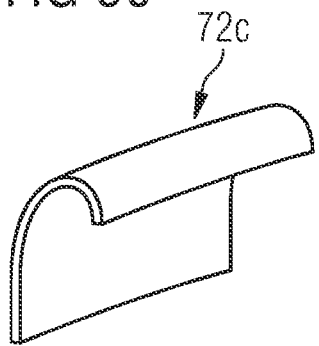

FIG. 7 illustrates an alternative arrangement for an enclosure 71 which may be accessed through a circular opening of the enclosure wall 70, with a circular hatch 73 and circular profile bracket 72 sealing the circular flange 74 of the enclosure to the hatch. FIG. 8 illustrates the circular flange 74 from above showing the locations 75 for the compressive fixings around the circumference of the flange and the elastomeric seal 76 inwardly of the compressive fixings. The compressive fixings may be covered by brackets having different generally circular outlines, although these may be formed in different ways. FIGS. 9a, 9b and 9c show example profiles for the brackets. FIG. 9a is based on angled profiles, in this case an annular disc 72a and two cylinders 78, 79 of different diameter in FIG. 9a. FIG. 9b is based on a continuous semi-circular cylindrical profile 72b. Another profile which may be used, is one extending the semi-circular profile on one side and shortening it on the other to give a more hook-like curved profile 72c as shown in FIG. 9c.

Amongst the advantages of the design according to the present invention are that the largest opening in the enclosure is sealed off by welding, and the integrity of the weld can be verified with a helium leak test, which increases the reliability of the product. All functional testing of the electrical components can be carried out with oil inside the enclosure and it is not necessary to drain the oil from the enclosure in order to weld and verify the tightness of the hatch, which reduces the assembly time. By welding on a frame over the hatch, the hatch can be reused and the flange on the enclosure is less prone to damage from the welding process because the hatch is not welded against the flange itself. Instead, the frame is welded to the flange and to the hatch. The bolts fixing the hatch to the flange are protected from the environment, reducing the risk of corrosion, so being more likely to be removable after the enclosure has been retrieved from its subsea location. The frame may be made of simple steel profiles, which can be sacrificed if the welded assembly has to be cut open. Keeping the hatch and enclosure flange undamaged during the opening operation keeps cost and required time down during servicing or repair. Another benefit is that it is possible to weld vertical hatches by sealing the elastomeric seal with the bolts and carrying out the necessary testing, without any backward step in the process, i.e. no components need to be removed after the test and before the final sealing by welding step. By only welding the L-profiles of one of the bracket types, the heat is in the bracket, not in the flange.

It should be noted that the term "comprising" does not exclude other elements or steps and "a" or "an" does not exclude a plurality. Elements described in association with different embodiments may be combined. It should also be noted that reference signs in the claims should not be construed as limiting the scope of the claims. Although the invention is illustrated and described in detail by the preferred embodiments, the invention is not limited by the examples disclosed, and other variations can be derived therefrom by a person skilled in the art without departing from the scope of the invention.

The invention claimed is:

1. A subsea enclosure arrangement for a subsea component, the subsea enclosure comprising: walls of a fluid tight material, each wall terminating in a flange extended over both outer and inner sides of the wall in a horizontal direction; a cover for closing the subsea enclosure along the inner sides of the flange; an elastomeric seal between the flange and the cover along the inner sides of the flange to fluid tight the subsea enclosure; compressive members to apply a compressive force to the elastomeric seal, via the cover and the flange; a bracket connecting the flange to the cover, the bracket extending in a vertical direction along the associated wall and further bending in a horizontal direction to cover the elastomeric seal, the compressive members, and the cover; a weld seal between the bracket and the flange; and a weld seal between the bracket and the cover; wherein the elastomeric seal comprises an O-ring seal; and adapted to receive the subsea component comprising at least one of a transformer, a variable speed drive, a pump, or a compressor.

2. The arrangement according to claim 1,
wherein the enclosure arrangement further comprises a test port formed at a location in the cover between the elastomeric seal and the compressive members.

3. The arrangement according to claim 1,
wherein the bracket comprises a plurality of angled profiles forming a rectangular outline; or a plurality of angled profiles forming a circular outline; or a curved profile forming a rectangular or circular outline.

4. The arrangement according to claim 1,
wherein the enclosure walls comprise a metal, or steel, or a plastic, or polyethylene.

5. The arrangement according to claim 1,
adapted to receive the subsea components and a pressure compensating fluid within the enclosure.

6. The arrangement according to claim 1,
adapted to receive a pressure compensating fluid comprising oil; or air, or other gas, or other gas comprising nitrogen.

7. A method of installing a subsea component in a subsea enclosure arrangement for a subsea component, the method comprising: installing one or more components comprising at least one of a transformer, a variable speed drive, a pump, or a compressor through an opening in the subsea enclosure comprising walls of a fluid tight material; fitting an elastomeric seal to an inner side of a flange of the walls of the subsea enclosure to enclose the opening; fitting a cover over the elastomeric seal to close the opening; applying a compressive force to the seal by tightening compressive members in the cover and flange; fitting a vertical side of a bracket along the walls and a horizontal side of the bracket to cover over the compressive members, elastomeric seal, and the cover; and welding the horizontal side of the bracket to the cover and the vertical side of the bracket to the flange.

8. The method according to claim 7, wherein the method further comprises:

filling the enclosure or components in the enclosure with a pressure compensating fluid.

9. The method according to claim 7,
wherein the pressure compensating fluid comprises oil or a gas.

10. The method according to claim 7, wherein the method further comprises:
forming a closable test port in the bracket between the seal welds on the bracket.

11. The method according to claim 7, wherein the method further comprises:
testing at the test port that a fluid tight seal has been formed between the inside of the enclosure and the ambient environment after applying the compressive force to the seal.

12. The method according to claim 11,
wherein the testing comprises applying a vacuum to attempt to suck helium gas from outside the enclosure through the elastomeric seal.

13. The method according to claim 7, wherein the method further comprises:
testing at the test port that a gas tight seal has been formed between the weld and the ambient environment.

14. The method according to claim 13,
wherein the testing comprises spraying Helium gas to the outer surface of the weld and applying a vacuum and a Helium sniffer probe at the test port to determine whether gas has passed through the weld seal.

15. The method according to claim 7,
wherein the elastomeric seal is fitted in a seat in the flange and a corresponding seat is provided in the cover.

* * * * *